(12) United States Patent
Tae et al.

(10) Patent No.: US 11,011,352 B2
(45) Date of Patent: May 18, 2021

(54) ATMOSPHERIC PRESSURE PLASMA DEVICE

(71) Applicants: Kyungpook National University Industry-Academic Cooperation Foundation, Daegu (KR); Electronics and Telecommunications Research Institute, Daejeon (KR)

(72) Inventors: Heung-Sik Tae, Daegu (KR); Choon-Sang Park, Daegu (KR); Gyu Tae Bae, Gyeongsangnam-do (KR); Hyung-Kun Lee, Daejeon (KR); Do Yeob Kim, Daejeon (KR)

(73) Assignee: Kyungpook National University Industry-Academic Cooperation Foundation, Daegu (KR)

( * ) Notice: Subject to any disclaimer, the term of this patent is extended or adjusted under 35 U.S.C. 154(b) by 0 days.

(21) Appl. No.: 16/789,133

(22) Filed: Feb. 12, 2020

(65) Prior Publication Data

US 2020/0258721 A1 Aug. 13, 2020

(30) Foreign Application Priority Data

Feb. 13, 2019 (KR) .................... 10-2019-0016580

(51) Int. Cl.
*H01J 37/32* (2006.01)
*B08B 7/00* (2006.01)
*C02F 1/46* (2006.01)

(52) U.S. Cl.
CPC ...... *H01J 37/32541* (2013.01); *B08B 7/0035* (2013.01); *H01J 37/32348* (2013.01);
(Continued)

(58) Field of Classification Search
CPC ........... H01J 37/32064; H01J 37/32348; H01J 37/32532; H01J 37/32541;
(Continued)

(56) References Cited

U.S. PATENT DOCUMENTS 5,587,207 A * 12/1996 Gorokhovsky ......... C23C 16/02
118/50
6,065,425 A * 5/2000 Takaki .................... C23C 16/24
118/718
(Continued)

FOREIGN PATENT DOCUMENTS

KR 100519126 10/2005
KR 100900967 6/2009
(Continued)

OTHER PUBLICATIONS

Korean Office Action (Notice of Preliminary Rejection) dated May 14, 2020 for Korean application No. 10-2019-0016580; 8pgs.

*Primary Examiner* — Jason Crawford
(74) *Attorney, Agent, or Firm* — Ohlandt, Greeley, Ruggiero & Perle, L.L.P.

(57) ABSTRACT

An atmospheric pressure plasma device is disclosed. The atmospheric pressure plasma device includes a conductive tube connected to a power device, an electrode formed as a plate and receiving power supplied from the conductive tube and a dielectric configured to control discharge instability by being formed to surround a side surface of the electrode.

5 Claims, 13 Drawing Sheets

(52) U.S. Cl.
CPC ...... *H01J 37/32825* (2013.01); *C02F 1/4608* (2013.01); *H01J 2237/327* (2013.01)

(58) Field of Classification Search
CPC ............. H01J 37/32825; H01J 37/3266; H01J 37/32798; H01J 2237/32; H01J 2237/327; B08B 7/0035
See application file for complete search history.

(56) References Cited

U.S. PATENT DOCUMENTS

| | | | | |
|---|---|---|---|---|
| 6,610,257 B2 * | 8/2003 | Vane | ................ | B08B 7/0035 422/186.04 |
| 6,635,228 B1 * | 10/2003 | Moore | ................ | B01D 53/323 422/186.04 |
| 6,956,329 B2 * | 10/2005 | Brooks | ............. | H01J 37/32009 315/111.31 |
| 2001/0031234 A1 * | 10/2001 | Christodoulatos | ... | H05H 1/2406 423/210 |
| 2002/0008088 A1 | 1/2002 | Suzuki | | |
| 2003/0106788 A1 * | 6/2003 | Babko-Malyi | ........ | F01N 3/0892 204/164 |
| 2003/0164143 A1 * | 9/2003 | Toyoda | ................ | H01L 21/205 118/723 E |
| 2005/0016456 A1 * | 1/2005 | Taguchi | ............... | H05H 1/2406 118/723 E |
| 2005/0139229 A1 * | 6/2005 | Kurunczi | ................ | A61L 2/14 134/1.1 |
| 2007/0068899 A1 * | 3/2007 | Yoon | ................... | H05H 1/2406 216/67 |
| 2008/0169065 A1 | 7/2008 | Takahashi | | |
| 2014/0328728 A1 * | 11/2014 | Misawa | ................. | B01J 19/08 422/186.21 |
| 2015/0126097 A1 * | 5/2015 | Li | ...................... | H01J 37/32568 451/450 |
| 2015/0274569 A1 * | 10/2015 | Boughton | ............ | H01J 37/3211 65/21.3 |
| 2016/0025656 A1 * | 1/2016 | Jevtic | ....................... | H05H 1/30 324/633 |
| 2016/0035541 A1 * | 2/2016 | Kozuka | ............... | H01J 37/3266 156/345.33 |
| 2016/0071698 A1 * | 3/2016 | Okino | ...................... | D01F 6/80 252/500 |
| 2016/0225589 A1 * | 8/2016 | Gerling | ............. | H01J 37/32532 |
| 2017/0027051 A1 | 1/2017 | Jevtic | | |
| 2018/0342379 A1 * | 11/2018 | Jurczyk | ............... | H01J 37/3444 |
| 2019/0287763 A1 * | 9/2019 | Tsui | ................... | H01J 37/32064 |

FOREIGN PATENT DOCUMENTS

| | | |
|---|---|---|
| KR | 20150123736 A | 11/2015 |
| KR | 101577207 B1 | 12/2015 |
| KR | 101871983 B1 | 6/2018 |

\* cited by examiner

ATMOSPHERIC PRESSURE PLASMA DEVICE

CROSS-REFERENCE TO RELATED APPLICATION

This application is based on and claims priority under 35 U.S.C. § 119 to Korean patent application number 10-2019-0016580, filed on Feb. 13, 2019, in the Korean Intellectual Property Office, the disclosure of which is incorporated by reference herein in its entirety.

BACKGROUND

1. Field

The disclosure is directed to an atmospheric pressure plasma device, and more specifically to an atmospheric pressure plasma device treating uniform plasma in a large area.

2. Description of Related Art

Plasma technology is used in treating contaminants. For example, plasma discharge technology may be used when treating contaminants on the surface of metal and silicon substrates or in treating wastewater.

The plasma treatment device may apply high voltage to an electrode and generate electrons or ions of high energy due to the discharge, and based on reacting an ion generated by colliding electrons or ions of generated high energy to a surface with surrounding materials, the plasma treatment device may be performed through the method of removing surface contaminants.

The atmospheric pressure plasma treatment device, however, has limitations in contaminant treatment of a large area object due to discharge instability as discharge is irregularly generated from a specific point, and even when plasma is generated to a large area object, there are limitations to uniform plasma treatment on large area objects due to non-uniform discharge.

Accordingly, there is a need for atmospheric pressure plasma treatment technology capable of uniform plasma treatment by controlling discharge instability on large area object.

SUMMARY

Embodiments of the disclosure provide an atmospheric pressure plasma device capable of uniformly treating a large area object and controlling discharge instability.

According to an embodiment, an atmospheric pressure plasma device includes a conductive tube connected to a power device, an electrode formed as a plate and receiving power supplied from the conductive tube and a dielectric to control discharge instability by being formed to surround a side surface of the electrode.

The electrode may, based on a predetermined voltage being applied from the power device, generate a plasma discharge consecutively from a plurality of points on the plate.

The plurality of points are formed in a circular shape, and the plasma discharge may be generated from a first point from the plurality of points, generated from a second point adjacent with the first point from the plurality of points of a predetermined period, generated from a third point adjacent with the second point from the plurality of points of a predetermined period, and generated by rotating for a predetermined period.

The power device may apply an alternating current (AC) to the electrode.

The electrode may be formed in a mesh shape.

The electrode may include a plate formed into at least one shape of a circular figure, an elliptic figure, polygonal figure, and a figure in which an apex is formed in a gentle curve.

According to an embodiment, an atmospheric pressure plasma device may uniformly treat a large area object and control a discharge instability by the atmospheric pressure plasma.

The effects of the disclosure are not limited to the disclosed effects above, and other effects not disclosed herein may be clearly understood by those skilled in the art from the disclosure below.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
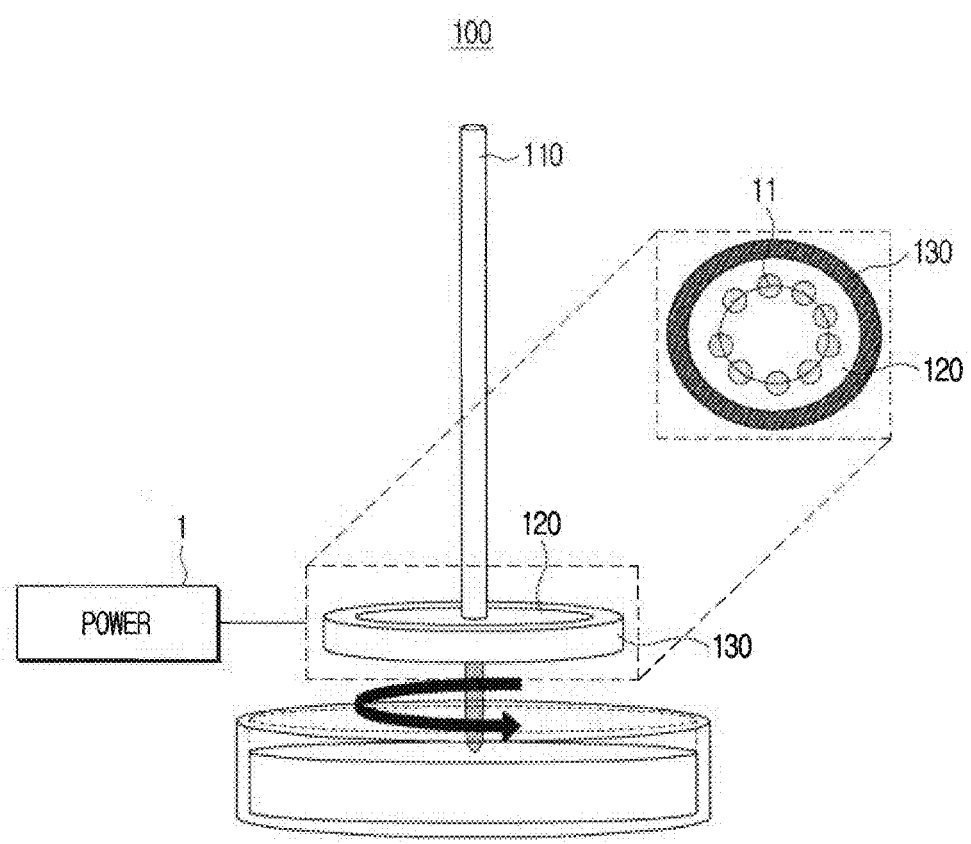
FIG. 1 is a diagram describing an atmospheric pressure plasma device according to an embodiment of the disclosure.

The following description with reference to the accompanying drawings is provided to assist in a comprehensive understanding of various embodiments of the disclosure. The embodiments disclosed in the disclosure may be variously modified. A specific embodiment may be illustrated in the drawings and described in greater detail in the detailed description. However, the specific embodiments disclosed in the enclosed drawings are merely to assist in the easy comprehension of the various embodiments. Accordingly, the disclosure is not limited to the specific embodiments disclosed in the enclosed drawings, and should be interpreted to include all equivalents or alternatives of the embodiments included in the ideas and the technical scopes disclosed herein.

The terms including ordinals such as first and second may be used to describe a variety of elements, but the elements may not be limited by the above-described terms. The above-described terms are only used for the purpose of distinguishing one element from another element.

In the disclosure, it is to be understood that the terms such as "comprise" or "consist of" are used herein to designate a presence of a characteristic, number, step, operation, element, component, or a combination thereof, and not to preclude a presence or a possibility of adding one or more of other characteristics, numbers, steps, operations, elements, components or a combination thereof. Based on a certain element being indicated as being "coupled with/to" or "connected to" another element, —part is "connected to" another part, it is to be understood that a certain element may be directly coupled with/to or connected to another element, but other element may be interposed therebetween. On the other hand, when a certain element is indicated as being "directly coupled with/to" or "directly connected to" another element, it is to be understood that no other element may be present therebetween. Unless otherwise specified, a singular expression includes a plural expression.

The specification only describes essential elements necessary in describing the disclosure, and elements unrelated to the essence of the disclosure have not been described. In addition, the disclosure should not be interpreted as including only the disclosed elements in an exclusive sense, but as capable of also including other elements in a non-exclusive sense.

In addition, in describing the disclosure, descriptions of well-known functions and constructions may be shortened or omitted if the description is determined as unnecessarily confusing the gist of the disclosure. Each embodiment may be independently implemented or operated but may also be implemented or operated in combination thereof.

FIG. 1 is a diagram describing an atmospheric pressure plasma device according to an embodiment of the disclosure.

Referring to FIG. 1, the atmospheric pressure plasma device 100 may include a conductive tube 110, an electrode 120, and dielectric 130.

The conductive tube 110 may be implemented to a column shape having a predetermined length. In FIG. 1, a conductive tube 110 of a column shape may be illustrated, but the conductive tube 110 may be implemented to various shapes. For example, the conductive tube 110 may be formed of a current flowing metal including copper, iron, and the like. An area of the conductive tube 110 may be coupled with the power device 1. The power device 1 may apply a predetermined high voltage to the conductive tube 110. According to an embodiment, the voltage applied by the power device 1 to the conductive tube 110 may be between several to several tens of kV. Further, the power device 1 may apply an alternating current (AC) voltage of a predetermined period to the conductive tube 110.

The electrode 120 may be formed into a plate. Further, the electrode 120 may be joined with the conductive tube 110 at a center or an edge area. The electrode 120 may be supplied with power from the power device 1 through the conductive tube 110. For example, the electrode 120 may be formed with current flowing metals including copper, iron, and the like to be the same as the conductive tube 120.

The electrode 20 may generate a plasma discharge by the voltage applied to the conductive tube 110. Further, the electrode 120 may generate plasma discharge consecutively from a plurality of points on the plate. The plasma discharge will be described in greater detail below.

The dielectric 130 may be formed to surround the side surface of the electrode 120 formed as a plate. For example, the dielectric 130 may be formed of a plastic material including polyvinylidene fluoride (PVDF) or the like, a glass, an electric tape, and the like.

FIGS. 2A to 2F are diagrams describing various shapes of electrodes according to an embodiment of the disclosure.

The electrode according to the disclosure may be formed into various figure shapes. For example, the electrode may be formed into the shape of a circular figure, an elliptic figure, polygonal figure, or a figure of various shapes in which an apex is formed in a gentle curve.

Figure 2A:
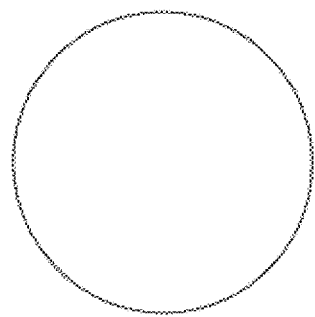
FIG. 2A is a diagram describing various shapes of electrodes according to an embodiment of the disclosure.
Figure 2B:
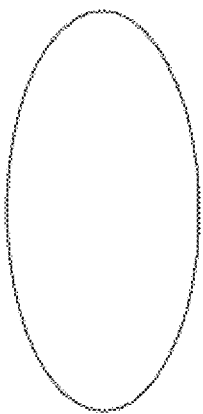
FIG. 2B is a diagram describing various shapes of electrodes according to an embodiment of the disclosure.
Figure 2C:
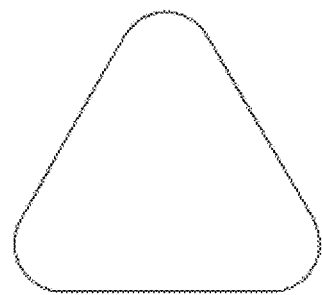
FIG. 2C is a diagram describing various shapes of electrodes according to an embodiment of the disclosure.
Figure 2D:
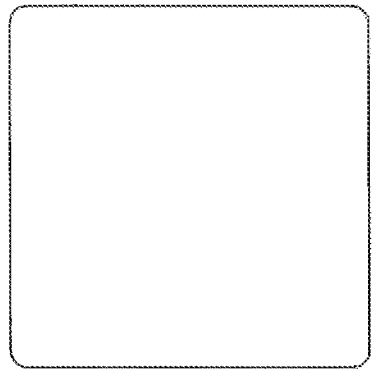
FIG. 2D is a diagram describing various shapes of electrodes according to an embodiment of the disclosure.

According to an embodiment, as illustrated in FIGS. 2A and 2B, the electrode may be formed in a completely circular shaped plate or a completely elliptic shaped plate. In addition, as illustrated in FIGS. 2C and 2D, the electrode may be formed to a triangular shaped plate or a square shaped plate. The apex area of the triangle or the square of the electrode plate may be treated as a curve and may be in a gentle shape with no apex present.

FIGS. 2C to 2D describe an example of an electrode plate that may basically be a triangle shape or a square shape, but the electrode plate may be formed as a polygonal shape including a pentagon, a hexagon, or the like. In addition, as described above, the apex area is treated as a curve and may be in a gentle shape with no apex present.

Figure 2E:
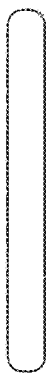
FIG. 2E is a diagram describing various shapes of electrodes according to an embodiment of the disclosure.
Figure 2F:
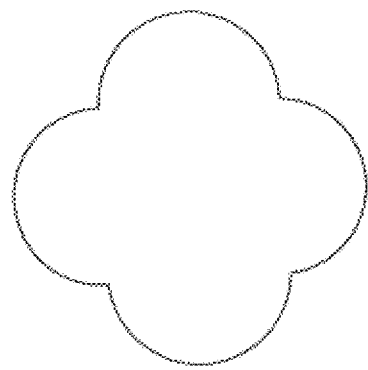
FIG. 2F is a diagram describing various shapes of electrodes according to an embodiment of the disclosure.

In addition, as illustrated in FIG. 2E, the electrode plate may be formed as a bar shape, and as illustrated in FIG. 2F, the electrode plate may be formed as a four-leaf clover shape. The shape of the electrode illustrated in FIGS. 2A to 2F is merely an embodiment, and the electrode may be formed to various shapes.

In the above, an example of the electrode plate of a disk shape and a dielectric surrounding the electrode plate have been described, but the electrode and the dielectric may be arranged to a different shape.

Figure 3A:
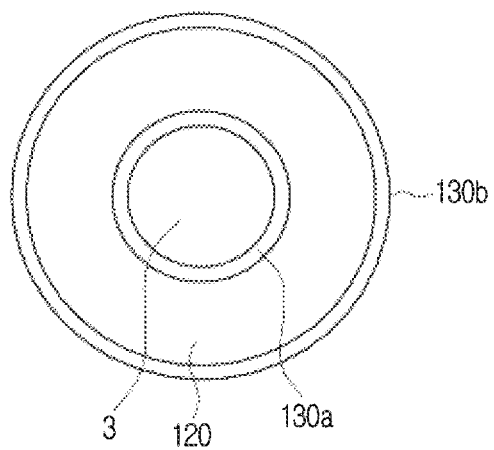
FIG. 3A is a diagram describing an arrangement of an electrode and a dielectric according to another embodiment of the disclosure.
Figure 3B:
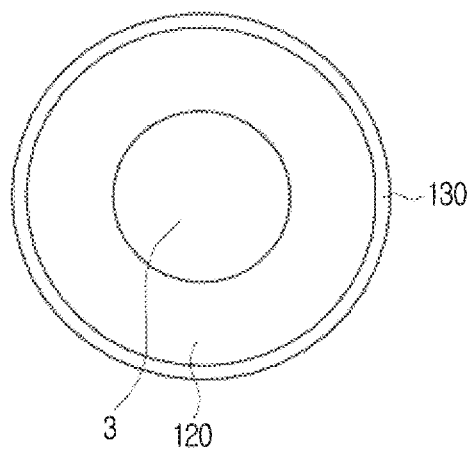
FIG. 3B is a diagram describing an arrangement of an electrode and a dielectric according to another embodiment of the disclosure.

FIGS. 3A to 3B are diagrams describing an arrangement of an electrode and a dielectric according to another embodiment of the disclosure.

Referring to FIG. 3A, an electrode including a hollow space 3 in a center area, the electrode 120 in the shape of the dielectrics 130a and 130b arranged to surround the inner side surface and the outer side surface of the electrode 120, and dielectrics 130a and 130b are disclosed. Based on power being applied to the electrode 120, a plasma discharge may be generated consecutively from the plurality of points of the plate of the electrode 120.

Referring to FIG. 3B, the electrode 120 including the hollow space 3 at the center area, the electrode 120 in the shape of the dielectric 130 arranged to surround an external side surface of the electrode 120, and a dielectric 130 are disclosed. Similar to the above, based on power being applied to the electrode 120, a plasma discharge may be generated consecutively from the plurality of points of the plate of the electrode 120.

In FIGS. 3A and 3B, a circular (or, a doughnut shape) electrode 120 may be illustrated, but as illustrated in FIGS. 2A to 2F, the electrode 120 may be formed to various shapes and the dielectric 130 may also be formed in a shape surrounding the inner side surface or the outer side surface corresponding to the electrode 120.

The discharge operation of the atmospheric pressure plasma device of the present disclosure will be described below.

Figure 4A:
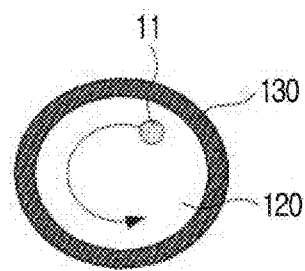
FIG. 4A is a diagram describing a discharge operation according to an embodiment of the disclosure.
Figure 4B:
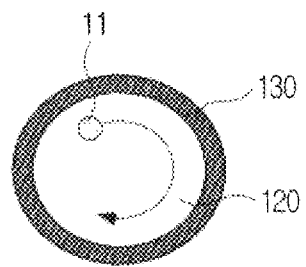
FIG. 4B is a diagram describing a discharge operation according to an embodiment of the disclosure

FIGS. 4A to 4B are diagrams describing a discharge operation according to an embodiment of the disclosure.

Referring to FIG. 4A, a diagram describing an example of a discharge point 11 of the atmospheric pressure plasma device rotating toward an anti-clockwise direction is illustrated, and referring to FIG. 4B, a diagram describing an example of a discharge point 11 of the atmospheric pressure plasma device rotating toward a clockwise direction is illustrated.

The atmospheric pressure plasma device of the disclosure generates plasma discharge from the electrode 120 due to the AC high voltage applied to the conductive tube. The atmospheric pressure plasma device may include an electrode 120 of a plane plate shape of a large area. Accordingly, a plasma discharge may be generated from an arbitrary first point of the electrode 120. The first point of the electrode 120 at which discharge is generated may be a point where charge is most accumulated. Accordingly, a dielectric polarization phenomenon may be generated at the dielectric 130 closest to the point discharge is generated. Further, the dielectric polarization may occur as the adjacent dielectric 130 is moved to an area. The charge may be accumulated again at the area of the dielectric 130 generated as the dielectric polarization is moved and at the second point of the adjacent electrode 120, and discharge may be generated again at the second point of the electrode 120 due to accumulation of charge. Based on the power device applying AC high voltage of a predetermined period to the conductive tube, the discharge from the second point may be generated after a predetermined time is passed.

That is, the plasma discharge may be generated from the first point of the electrode 120, and may be generated from the second point adjacent to the first point after the predetermined period. Further, the plasma discharge may be generated from a third point adjacent with the second point after the predetermined period. Accordingly, the plasma discharge may be consecutively generated from the first point, the second point, the third point and an n-th point. That is, the plasma discharge may be consecutively generated from the plurality of points on the electrode plate, and generated by rotating for a predetermined period.

The points 11 at which plasma discharge is generated may be arranged to correspond with the shape of the electrode 120 (or, shape of the dielectric 130). For example, as illustrated in FIGS. 4A to 4B, based on the electrode 120 and the dielectric 130 being a circular shape, the points 11 at which discharge is generated may be arranged in a circular shape. Further, as illustrated in FIG. 4A, the plasma discharge may be generated along the plurality of points by rotating in the anti-clockwise direction. In addition, as illustrated in FIG. 4B, the plasma discharge may be generated along the plurality of points by rotating in the clockwise direction.

Figure 5:
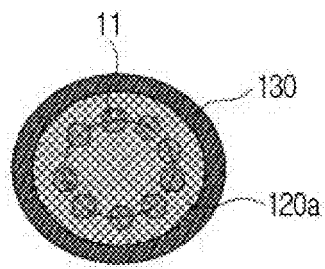
FIG. 5 is a diagram describing an atmospheric pressure plasma device according to another embodiment of the disclosure.

FIG. 5 is a diagram describing an atmospheric pressure plasma device according to another embodiment of the disclosure.

Referring to FIG. 5, an embodiment of an electrode 120a being formed in a mesh shape is illustrated. The conductive tube and the dielectric is the same as described above and a detailed description will be omitted. The electrode 120a may be formed in a mesh shape. Based on the electrode 120a being formed in mesh shape, plasma discharge may occur between the mesh lattice. Even when the electrode 120 is formed as a mesh, the discharge point 11, like the electrode of a plate shape without holes, may be moved in a clockwise direction corresponding to the shape of the electrode 120a (or, shape of the dielectric 130) or moved in an anti-clockwise direction. That is, the plasma discharge may be generated by rotating in the clockwise direction or the anti-clockwise direction for a predetermined period.

The plasma discharge may be generated only at one point of the mesh lattice if the lattice of the mesh is too large. Accordingly, it may be more advantageous based on the size of mesh lattice being smaller, and according to an embodiment, the size of the lattice may be several to several tens of um.

Figure 6:
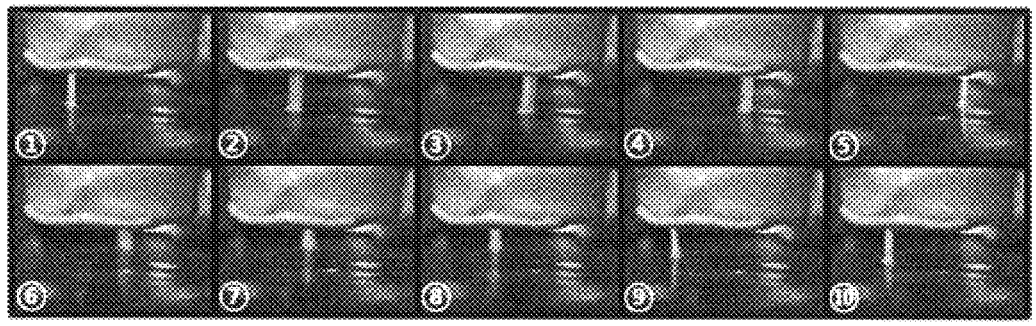
FIG. 6 is a diagram describing a discharge test of an atmospheric pressure plasma device according to an embodiment of the disclosure.

FIG. 6 is a diagram describing a discharge test of an atmospheric pressure plasma device according to an embodiment of the disclosure.

Referring to FIG. 6, an image of a plasma discharge test of the atmospheric pressure plasma device is illustrated. As illustrated in FIG. 6, the plasma discharge may be generated as the discharge point is moved in the anti-clockwise direction as time passes.

As described above, the atmospheric pressure plasma device of the disclosure may generate discharge uniformly by rotating at predetermined time intervals in an electrode of a large area. Accordingly, the atmospheric pressure plasma device may treat plasma uniformly on a large area object. The plasma device of the disclosure may be applied to a variety of fields such as wastewater treatment, surface treatment of metal or silicon substrate, water quality sensor, and the field of biology.

What is claimed is:

1. An atmospheric pressure plasma device comprising:
   a conductive tube connected to a power device;
   an electrode formed as a plate and receiving power supplied from the conductive tube and being joined with the conductive tube; and
   a dielectric formed to surround an outer side surface of the electrode, not to surround a lower surface of the electrode and control discharge instability,
   wherein the electrode consecutively generates a plasma discharge from a plurality of points on the plate based on a predetermined voltage being applied from the power device and generates plasma toward the lower surface of the electrode.

2. The device of claim 1, wherein the plurality of points are formed in a circular shape, and wherein the plasma discharge is configured to:
   generate from a first point from the plurality of points, generate at a second point adjacent to the first point from the plurality of points after a predetermined period, generate at a third point adjacent to the second point from the plurality of points after a predetermined period, and generate by rotating to a predetermined period.

3. The device of claim 1, wherein the power device is configured to apply an alternating current (AC) to the electrode.

4. The device of claim 1, wherein the electrode is formed in a mesh shape.

5. The device of claim 1, wherein the plate has a shape selected from a group consisting of a circular figure, an elliptic figure, a polygonal figure, and a figure formed as a gentle curve.

* * * * *

UNITED STATES PATENT AND TRADEMARK OFFICE
CERTIFICATE OF CORRECTION

| | |
|---|---|
| PATENT NO. | : 11,011,352 B2 |
| APPLICATION NO. | : 16/789133 |
| DATED | : May 18, 2021 |
| INVENTOR(S) | : Heung-Sik Tae et al. |

It is certified that error appears in the above-identified patent and that said Letters Patent is hereby corrected as shown below:

On the Title Page

Item (73), Correct: "Kyungpook National University Industry-Academic Cooperation Foundation, Daegu (KR)" to -- Kyungpook National University Industry-Academic Cooperation Foundation, Daegu (KR) and Electronics and Telecommunications Research Institute, Daejeon , (KR) --.

Signed and Sealed this
Thirteenth Day of December, 2022

Katherine Kelly Vidal
*Director of the United States Patent and Trademark Office*